United States Patent
Anderson et al.

(10) Patent No.: US 8,232,998 B2
(45) Date of Patent: Jul. 31, 2012

(54) METHODS AND APPARATUS FOR ESTIMATING AND CONTROLLING BEHAVIOR OF ANIMATRONICS UNITS

(75) Inventors: John Anderson, San Anselmo, CA (US); Rob Cook, San Anselmo, CA (US)

(73) Assignee: Pixar, Emeryville, CA (US)

(*) Notice: Subject to any disclaimer, the term of this patent is extended or adjusted under 35 U.S.C. 154(b) by 1231 days.

(21) Appl. No.: 11/958,239

(22) Filed: Dec. 17, 2007

(65) Prior Publication Data
US 2009/0153566 A1    Jun. 18, 2009

(51) Int. Cl.
*G06T 13/00* (2011.01)
(52) U.S. Cl. .......................... 345/473; 345/474
(58) Field of Classification Search .................. None
See application file for complete search history.

(56) References Cited

U.S. PATENT DOCUMENTS

2005/0153624 A1* 7/2005 Wieland et al. ............... 446/269
2008/0188971 A1* 8/2008 Maier ............................ 700/103
* cited by examiner

*Primary Examiner* — Kee M Tung
*Assistant Examiner* — Jwalant Amin
(74) *Attorney, Agent, or Firm* — Philip H. Albert; Kilpatrick Townsend & Stockton LLP

(57) ABSTRACT

A method for determining behavior of an animatronics unit includes receiving animation data comprising artistically determined motions for at least a portion of an animated character, determining a plurality of control signals to be applied to at least the portion of the animatronics unit in response to the animation data, estimating the behavior of at least the portion of the animatronics unit in response to the plurality of control signals by driving a software simulation of at least the portion of the animatronics unit with the plurality of control signals, and outputting a representation of the behavior of at least the portion of the animatronics unit to a user.

20 Claims, 7 Drawing Sheets

METHODS AND APPARATUS FOR ESTIMATING AND CONTROLLING BEHAVIOR OF ANIMATRONICS UNITS

BACKGROUND OF THE INVENTION

The present invention relates to animations. More specifically, the present invention relates to methods and apparatus for designing animatronics units based upon articulated computer generated characters.

Throughout the years, movie makers have often tried to tell stories involving make-believe creatures, far away places, and fantastic things. To do so, they have often relied on animation techniques to bring the make-believe to "life." Two of the major paths in animation have traditionally included, drawing-based animation techniques and stop motion animation techniques.

Drawing-based animation techniques were refined in the twentieth century, by movie makers such as Walt Disney and used in movies such as "Snow White and the Seven Dwarfs" (1937) and "Fantasia" (1940). This animation technique typically required artists to hand-draw (or paint) animated images onto a transparent media or cels. After painting, each cel would then be captured or recorded onto film as one or more frames in a movie.

Stop motion-based animation techniques typically required the construction of miniature sets, props, and characters. The filmmakers would construct the sets, add props, and position the miniature characters in a pose. After the animator was happy with how everything was arranged, one or more frames of film would be taken of that specific arrangement. Stop motion animation techniques were developed by movie makers such as Willis O'Brien for movies such as "King Kong" (1933). Subsequently, these techniques were refined by animators such as Ray Harryhausen for movies including "Mighty Joe Young" (1948) and Clash Of The Titans (1981).

With the wide-spread availability of computers in the later part of the twentieth century, animators began to rely upon computers to assist in the animation process. This included using computers to facilitate drawing-based animation, for example, by painting images, by generating in-between images ("tweening"), and the like. This also included using computers to augment stop motion animation techniques. For example, physical models could be represented by virtual models in computer memory, and manipulated.

One of the pioneering companies in the computer generated imagery (CGI) industry was Pixar. Pixar is more widely known as Pixar Animation Studios, the creators of animated features such as "Toy Story" (1995) and "Toy Story 2" (1999), "A Bugs Life" (1998), "Monsters, Inc." (2001), "Finding Nemo" (2003), "The Incredibles" (2004), "Cars" (2006), "Ratatouille" (2007). In addition to creating animated features, Pixar developed computing platforms specially designed for CGI, and CGI software now known as RenderMan®. The RenderMan® software included a "rendering engine" that "rendered" or converted geometric and/or mathematical descriptions of animated objects or characters into a two dimensional image. RenderMan® was well received in the animation industry and recognized with two Academy Awards®.

The inventors of the present invention now desire to extend the reach of its animated characters beyond two-dimension images and into the third-dimension (e.g. the physical world). To do this, the inventors have devised methods for constructing and controlling of physical versions (e.g. electrically, mechanically, pneumatically, and/or hydraulically controlled devices) of animated characters appearing in various features.

The use of physical, mechanical devices for live entertainment purposes was pioneered by The Walt Disney Company and is now often referred to in the industry as "animatronics." Animatronics characters or units have been previously used in well-known theme park attractions (e.g. performances, rides), such as the Pirates of the Caribbean, Enchanted Tiki Room, Great Moments with Mr. Lincoln, and many others.

A problem recognized by the inventors is that because animatronics units are used for specific purposes, the hardware cannot be purchased off-the-shelf, and must often be custom-built. A major challenge recognized by the inventors is how to specify and build an animatronics unit that can move in the ways recognized by an audience. More specifically, a problem is how to build and control an animatronics characters that can more faithfully represent the animation of the characters in the feature, movie, short, etc., than is currently possible.

It is believed that animation data from a computer generated (CG) character has never been used to help specify the construction of an animatronics characters. Further, it is believed that animation data from a CG character has never been used to control such animatronics characters.

In light of the above, what is desired are methods and apparatus for solving the challenges described above.

BRIEF SUMMARY OF THE INVENTION

The present invention relates to animatronics. More specifically, the present invention relates to methods and apparatus for designing animatronics characters or units based upon the animation of computer generated characters.

According to one aspect of the invention, methods for determining behavior of an animatronics unit are described. A technique includes receiving animation data comprising artistically determined motions for at least a portion of an animated character, and determining a plurality of control signals to be applied to the animatronics unit in response to the animation data. a process includes estimating the behavior of the animatronics unit in response to the plurality of control signals by driving a software simulation of the animatronics unit with the plurality of control signals and outputting a representation of the behavior of the animatronics unit to a user.

According to another aspect of the invention, computer systems for determining behavior of an animatronics unit are described. An apparatus includes a memory configured to store animation data comprising artistically determined motions for at least a portion of an animated character. A device includes a processor, wherein the processor is configured to determine a plurality of control signals to be applied to the animatronics unit in response to the animation data, wherein the processor is configured to estimate the behavior of the animatronics unit in response to the plurality of control signals by driving a software simulation of the animatronics unit with the plurality of control signals, and wherein the processor is configured to output a representation of the behavior of the animatronics unit to a user.

According to yet another aspect of the invention, computer program products resident on a tangible media comprises executable code that is executable on a computer system, wherein the computer system includes a processor and a memory. In some embodiments, the computer program product includes code configured to direct the processor to receive animation data comprising artistically determined motions for at least a portion of an animated character, and code configured to direct the processor to determine a plurality of control signals to be applied to the animatronics unit in response to the animation data. In some embodiments the computer program product includes code configured to direct the processor to estimate the behavior of the animatronics unit in response to the plurality of control signals by driving a software simulation of the animatronics unit with the plurality of control signals, and code configured to direct the processor to output a representation of the behavior of the animatronics unit to a user. The codes may reside on a computer readable tangible media such as optical media (DVD, HD DVD, Blu Ray DVD, holographic media, and the like), magnetic media (hard disk drive, floppy disk drive, and the like), semiconductor media (flash memory, RAM, ROM, and the like).

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings.

DETAILED DESCRIPTION OF THE INVENTION

Figure 1:
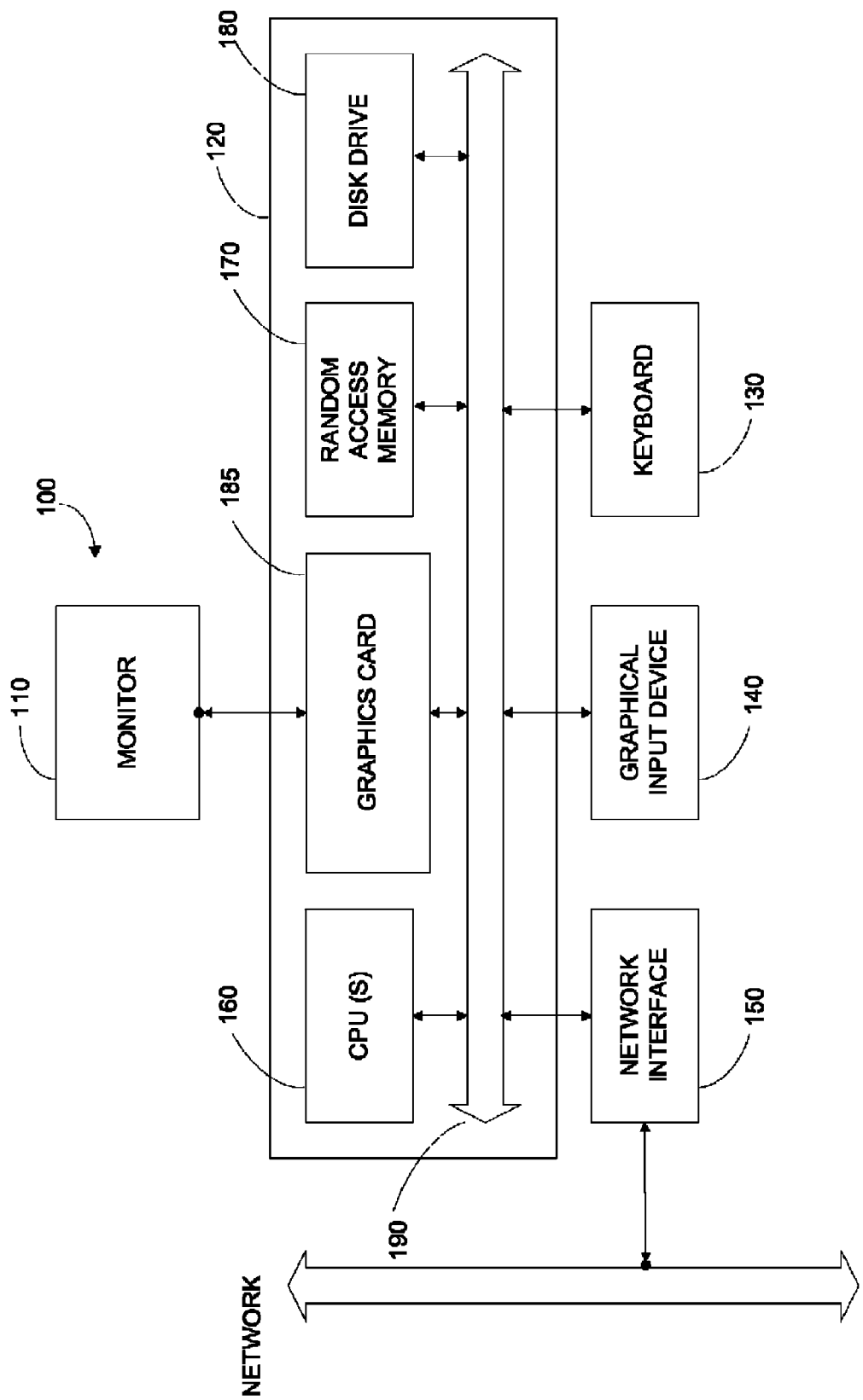
FIG. 1 is a block diagram of typical computer system according to various embodiments of the present invention.

FIG. 1 is a block diagram of typical computer system 100 according to an embodiment of the present invention.

In the present embodiment, computer system 100 typically includes a display/monitor 110, computer 120, a keyboard 130, a user input device 140, computer interfaces 150, and the like.

In the present embodiment, user input device 140 is typically embodied as a computer mouse, a trackball, a track pad, a joystick, wireless remote, drawing tablet, voice command system, eye tracking system, and the like. User input device 140 typically allows a user to select objects, icons, text and the like that appear on the monitor 110 via a command such as a click of a button or the like. In some embodiments, monitor 110 may be an interactive touch-screen, such as a Cintiq manufactured by Wacom, or the like. A graphics card 185 typically drives the display 110.

Embodiments of computer interfaces 150 typically include an Ethernet card, a modem (telephone, satellite, cable, ISDN), (asynchronous) digital subscriber line (DSL) unit, FireWire interface, USB interface, and the like. For example, computer interfaces 150 may be coupled to a computer network, to a FireWire bus, or the like. In other embodiments, computer interfaces 150 may be physically integrated on the motherboard of computer 120, may be a software program, such as soft DSL, or the like.

In various embodiments, computer 120 typically includes familiar computer components such as a processor 160, and memory storage devices, such as a random access memory (RAM) 170, disk drives 180, and system bus 190 interconnecting the above components.

In one embodiment, computer 120 includes one or more Xeon microprocessors from Intel. Further, in the present embodiment, computer 120 typically includes a UNIX-based operating system.

RAM 170 and disk drive 180 are examples of tangible media configured to store data such as animation data, animation timing sheets, an animation environment, animatronics unit design construction, implementations of mathematical algorithms, a simulation of an animatronics unit, image files, software models including geometrical descriptions of objects, ordered geometric descriptions of objects, procedural descriptions of models, scene descriptor files, a rendering engine, embodiments of the present invention, including executable computer code, human readable code, or the like. Other types of computer-readable tangible media include magnetic storage media such as floppy disks, networked hard disks, or removable hard disks; optical storage media such as CD-ROMS, DVDs, Holographic memory and bar codes; semiconductor memories such as flash memories, read-only-memories (ROMS); battery-backed volatile memories; networked storage devices, and the like.

In the present embodiment, computer system 100 may also include software that enables communications over a network such as the HTTP, TCP/IP, RTP/RTSP protocols, and the like. In alternative embodiments of the present invention, other communications software and transfer protocols may also be used, for example IPX, UDP or the like.

FIG. 1 is representative of a computer system capable of embodying various aspects of the present invention. It will be readily apparent to one of ordinary skill in the art that many other hardware and software configurations are suitable for use with the present invention. For example, the computer may be a desktop, portable, rack-mounted or tablet configuration. Additionally, the computer may be a series of networked computers. Further, the use of other micro processors are contemplated, such as Xeon™, Pentium™ or Core™ microprocessors; Turion™ 64, Opteron™ or Athlon™ microprocessors from Advanced Micro Devices, Inc; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Figure 2A:
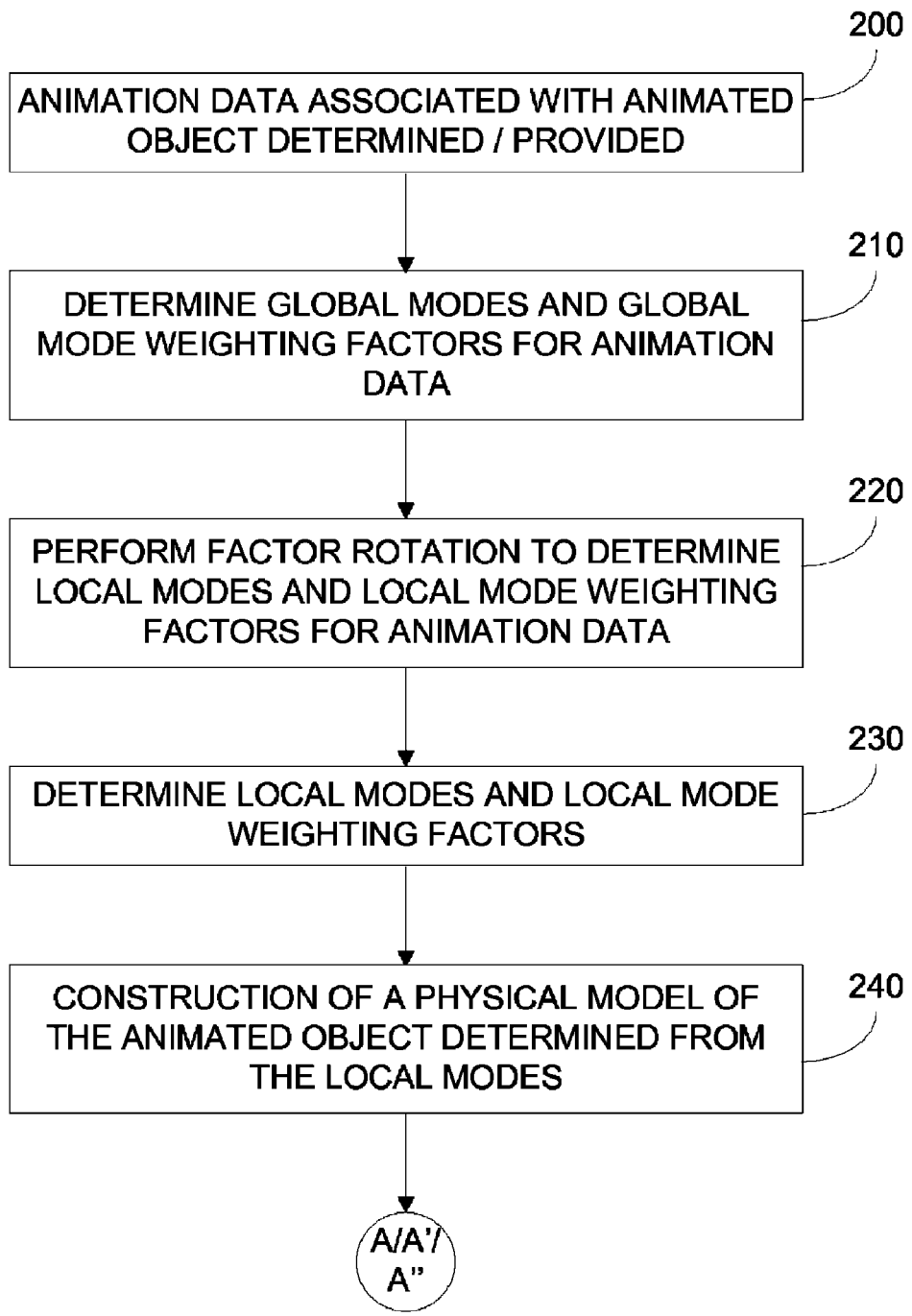
FIGS. 2A-B illustrates a block diagram of a process according to various embodiments of the present invention.
Figure 2B:
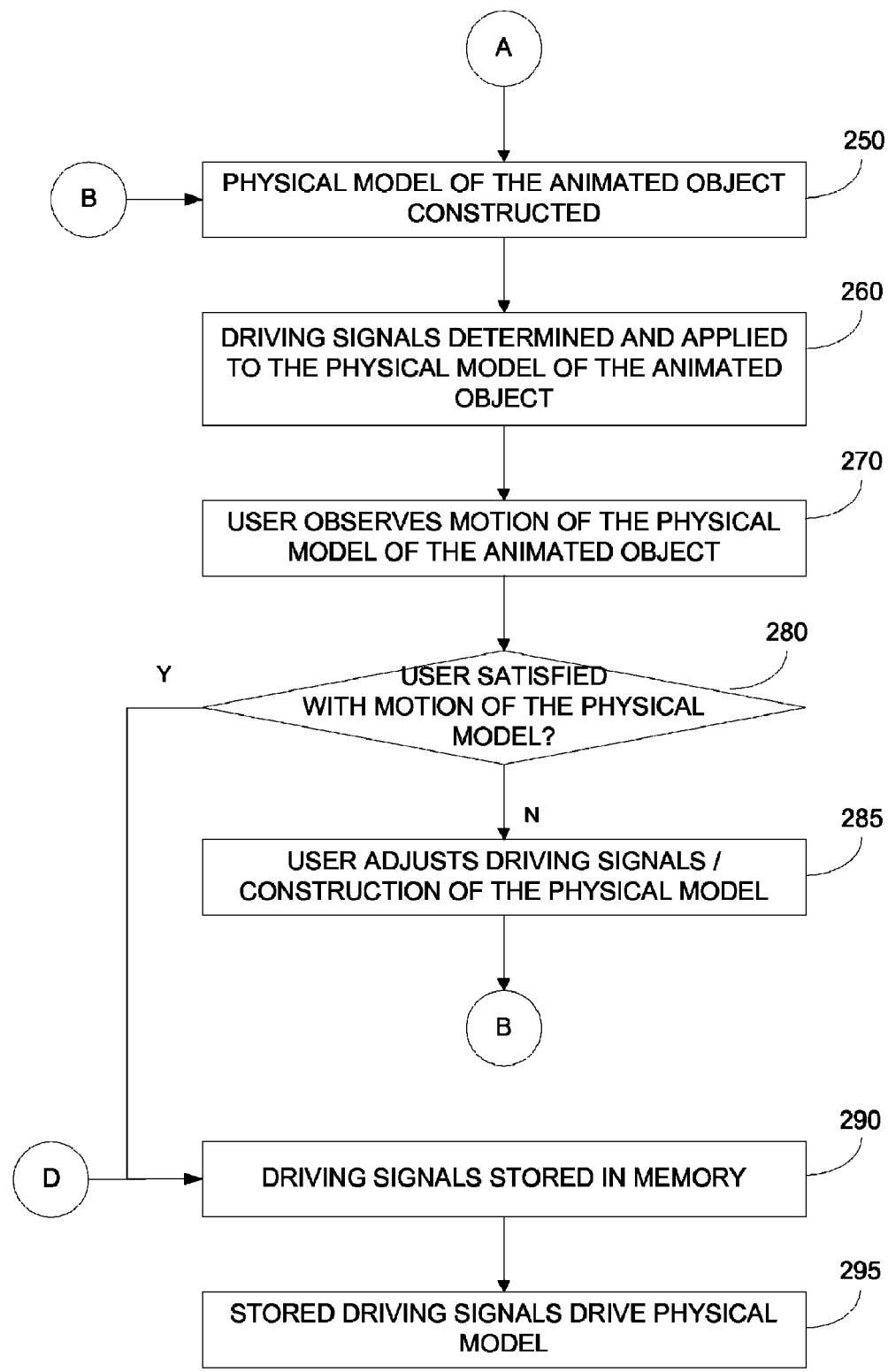

FIGS. 2A-B illustrate a block diagram of a process according to various embodiments of the present invention. More specifically, FIGS. 2A-B provide a high-level illustration of various embodiments of determining how to construct a physical model of an object.

Initially, artistically determined animation data associated with a software model of the object is provided to computer system 100, step 200. In some embodiments of the present invention, the animation data may be the same animation data used to animate the software model of the object for a movie, feature, short, or the like. In various embodiments, the animation data may represent a specified range (e.g. a "training set," "on model motion" (i.e. characteristic motions of the object), etc.) of movements desired for the physical model of the object. As an example, in a movie, a face of an animated character may wink both eyes, however, it may be desired that the physical model of the face of animated character may wink only her left eye. Accordingly, the animation data (e.g.

the "training set," "on model motion," etc.) provided in this step may include only the face of the animated character winking only her left eye. In various embodiments, as discussed, the animation data may be specified for an object such as an animated character, or a portion of the animated character (e.g. a face).

In various embodiments of the present invention, the animation data is typically specified for a certain amount of time. For instance, the animation data may be associated with a specific scene in a feature (e.g. movie, short, or the like), a specific series of scenes, a specific time interval, or the like. In various embodiments, the amount of time may be freely determined by the user. In other embodiments, the amount of time may be specified by other users. Once the period of time has been specified, the range of animation data may be easily determined.

In various embodiments, the animation data may be specified at a rate of approximately twenty-four (24) frames a second (typical cinema frame rate), a rate of approximately twenty-five (25) or approximately thirty (30) frames a second (typical television frame rate), a rate of approximately sixty (60) frames a second (HD frame rate), or the like. In such embodiments, animation data values may be specified at such data rates.

In various embodiments, the animation data may take many different forms. In some embodiments, the animation data includes three-dimensional coordinates of positions of the animated object. As an example, the animated object to be animated may be a face. In such an example, the animation data may represent three-dimensional coordinates (e.g. (x,y,z) coordinates) of surface positions on the face in a static coordinate system with respect to time. In other embodiments, the three-dimensional coordinates may be offsets relative to a "rest" or default pose for the face with respect to time. For example, for a point on a tip of a nose, (x,y,z) values may be (−0.1, 0.2, −0.1) representing the tip of the nose moving from a base pose −0.1 in the x direction, for example, to the left; 0.2 in the y direction, for example upwards; and −0.1 in the z direction, for example, flattening. In various embodiments the positions may be positions on the surface of the animated object, may be positions inside the animated object, a combination of such positions, and the like.

Mathematically, the animation data may be represented in some embodiments as follows:

$$\{X_{i,t}, Y_{i,t}, Z_{i,t}\}: i=1\ldots m, t=1\ldots T$$

In various embodiments, "m" represents the number of surface positions provided in the animation data, and "T" represents the number of frames of animation data. For example, m may be on the order of 100-1000 data points, 1000-3000 data points, or greater, or the like. Additionally, T may be on the order of tens of frames to thousands of frames, e.g. 25-100 frames, 100-1000 frames, 1000-4000 frames, or greater, or the like.

In various embodiments, the animation data may be received in a more abstract form, such as a cue sheet, an animation timing sheet, or the like. In various embodiments, the animation timing sheet includes data values for animation variables (avars) for each frame included in the period of time. In other embodiments, the animation data may include spline data associated with the avars; may include key frame values specified for the avars, or the like. In various embodiments of the present invention, in some cases where the animation data is in more abstract form, it is contemplated that the absolute or relative positional values for points of the animated object be determined within step 200.

In various embodiments of the present invention, in response to the animation data, a decomposition analysis is performed to determine global modes, and global mode weighting values for the animation data, step 210. In various embodiments, a single value decomposition process is performed by a principal component analysis (PCA) technique, although in other embodiments, other analysis techniques may also be used. In some embodiments, the principal modes may be termed "eigenvectors" and the mode weighing values may be termed "eigenvalues." As is known using such techniques, the global modes determined are principal with respect to the data set. In various embodiments, where the animation data includes three-dimensional positional data of surface points, the global principal modes include global modes of movements of the surface points of the animated object. An example of this will be illustrated below.

Mathematically, the decomposition (in one dimension) may be represented in some embodiments as follows:

$$X_{i,t} = \Sigma_{j=1}^{N} \{b_{i,j} a_{t,j}\}$$

In various embodiments, "N" represents the number of principal modes, the b represent the global modes, and $a_{t,j}$ represents the weighting factors.

Next, in various embodiments, in response to the global modes and (global mode) weighting values, a factor rotation is performed to determine local modes and (local mode) weighting values, step 220. In contrast to the global data, in various embodiments, the local modes specify locations of movements of the surface points, for example, of the animated object that are relatively independent of (often distant) surface points. An example of this will be illustrated below.

More generally, the basis functions can be transformed to any linearly independent set that spans the same space in such a way to make the basis functions more directly related to the controls of the animatronics unit. In some specific embodiments, what is desired is the determination of a factor rotation matrix "R" (generally a symmetric square matrix) where $R^T = R$, and $b'_{i,j}$, the local modes, are localized according to the following relationship:

$$b_{i,j} R = b'_{i,j}$$

Using such embodiments, the equation above becomes:

$$X_{i,t} = \Sigma_{j=1}^{N} \{b'_{i,j} R^T a_{t,j}\}$$

In this equation, $b'_{i,j} R^T$ represents the local modes.

In some embodiments of the present invention, one factor rotation technique implemented is a "Varimax" orthogonal rotation analysis. In other embodiments, other factor rotation techniques may be used. As mentioned, a result of this technique is that movement of positions of an animated object specified in the data set, are localized according to a given criteria, e.g. least-squares minimum error, or the like.

In various embodiments, based upon the identified local modes, the user determines a number of "primary" local modes, step 230. In some embodiments, the number of local modes may be associated with the number of physical control structures included in the construction of the physical model of the object. As an example, based upon the local modes, the user may specify a number of individual regions which to assign a control structure. For example, for an upper arm, the user may select one local mode that is associated with a bicep region of an object to be a primary local mode.

Next, based upon the primary local modes, the user may specify construction of the physical model of the object, step 240. In various embodiments, physical control structures may be associated with one or more physical devices that provide the desired movement.

In various embodiments, physical control structures may be any combination of pulling or pushing electric motors; stretching or pinching hydraulic, pneumatic, or fluid control systems; rotational or shearing systems; or any combination of the above. As examples, one fluid control system can be used for an animated face to make eye balls bulge; an electric motor may be pull skin behind the eyes to make the eyes open; and the like. In light of the present disclosure, it should be evident to one of ordinary skill in the art that many other types of controlled physical structure maybe be used to cause the desired user movement of surface positions of the physical model of the object. Additional examples will be illustrated below.

FIG. 2B illustrates a high-level illustration of various embodiments for observing and adjusting the movement of the physical model of the object.

Based upon the construction specification, a physical model of the animated object (the animatronics unit) can be built, step 250. As discussed above, any conventional number of physical components may be used to manipulate (e.g. move, deflect, bend, stretch, or the like) the different portions of the physical model.

In various embodiments, the local mode weighting values determined in step 220 that are associated with the primary local modes are determined and applied to the respective physical control structures in the form of driving signals, step 260. As an example, one primary local mode may specify that cheeks of an animated face rise and extend from the face when the face smiles. Accordingly, the local modes are multiplied by their associated weighting factors, and the product is applied to the cheek rising control structures. As another example, based upon the weighting factors, signals are sent to two electric motors positioned beneath a "skin" of the animated face. In turn, the two electric motors may rotate and push in the upwards direction.

In various embodiments of the present invention, in step 260 driving signals may be based upon specified animation data. In some embodiments, the animation data provided in step 200 may be considered "training data" which specifies the desired maximum range of motion for the animated object so that the physical model of the object can be built. In step 260, specified animation data used may specify a subset range of animation compared to the training data. For instance, the training animation data may include both eyes of a character individually winking, and the specified animation data used in step 260 may simply be the left eye of a character winking.

In various embodiments where specified animation data is provided, the associated weighting factors can be modified according to the local modes determined in step 230. Then, based upon the associated weighting factors, specific driving signals are determined and applied to the physical model of the object (the animatronics unit), in step 260. The user may then observe the controlled motion of the physical model of the object in, step 270.

In various embodiments, the poses and motions of the physical model of the object, are visually compared to the desired poses and motions of the object, step 280. For example, the user may see that the physical model of the object is not fully straightening or fully retracting a limb, not smiling, or the like; the physical model is not moving at the proper speed, or follow the desired path, or the like. In other embodiments, the user (e.g. an animator) may determine whether the movement of the physical model of the object achieves the desired "look" of the animated character or a portion of the animated character.

In response to the visual comparisons, the user may adjust the weighting factors and/or driving signals, step 285. As discussed above, as the local modes may overlap on the object, and only some local modes may be implemented in the physical model, thus duplicating specific poses may be difficult. Additionally, physical construction may not truly mimic the desired local modes because of physical limitations of the components, e.g. non-linear elastic materials, and the like. Accordingly, the actual range of poses of the physical model of the object may not look exactly like the animated character (the desired motion). Because of this, it is often expected that the user must adjust the weighting factors, the physical construction of the physical model of the object, or the like. The process described above, may then be repeated to see if the adjustments help or not. Further details and other embodiments are given below.

In cases where the user is satisfied with the motion and the physical poses of the physical model (or modified physical model) of the object, the control data, e.g. the weighting factors, control signals sent to the control structures, or the like may be stored in a memory, step 290. The control data from the memory may then drive the physical model of the object within its desired "regular" operation mode, for example on an amusement ride or attraction, performance or the like, step 295. In various embodiments, a conventional computer system, e.g. computer system 100 remote from the physical model may control the object. In other embodiments, dedicated computer systems, embedded system, or the like may be used to store the control data, control signals for the control structures, or the like, to control the physical model of the object.

As merely one example, a toy may be specified and constructed according to the principles described above, to have movement similar to that specified by the desired animation data. The desired driving data can then be converted into control signals that are stored as computer executable instructions on an on-board memory such as a flash memory, ROM, or the like, and drive a microprocessor embedded within the toy to control the movement of the toy.

Figure 3:
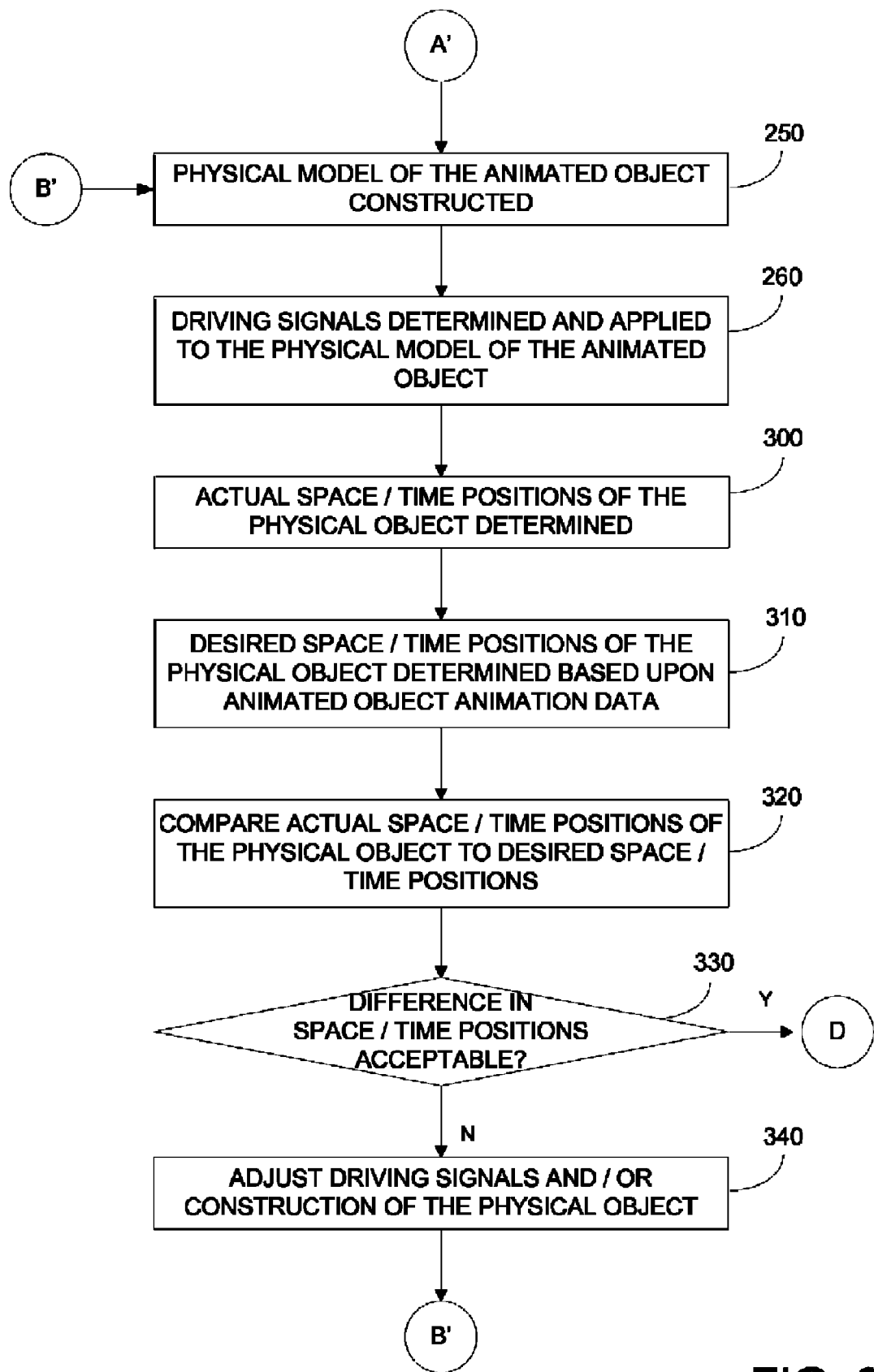
FIG. 3 illustrates a block diagram of an additional process according to various embodiments of the present invention.

FIG. 3 illustrates a block diagram of an additional process according to various embodiments of the present invention. More specifically, FIG. 3 provides a high-level illustration of embodiments for modifying movement of the physical model of the object.

Initially, as in FIG. 2B, based upon the construction specification, a physical model of the animated object (the animatronics unit) can be built, step 250. As discussed above, any conventional number of physical components may be used to manipulate (e.g. move, deflect, bend, stretch, or the like) the different portions of the physical model.

In various embodiments, the appropriate driving signals may be determined and applied to the physical model in step 260. The inventors recognize that the process for matching the physical motion of the physical model to the desired motion is a space-time problem, and can be at least partially solved with a computer. Accordingly, in step 260, an "initial guess" of the appropriate driving signals are applied to the physical model.

In various embodiments, the poses and motions of the physical model of the object are then recorded into a computer system, and/or are observed by a user in step 300. Specifically, the actual space/time positions (or other constraints) of the physical model of the object are determined in step 300. In various embodiments of the present invention, many different ways to perform this are contemplated. Various embodiment includes using servo motors located at specific joints, or the like of the physical model. In such embodiments, the angular positions of the servo motors are monitored with respect to animation time, to help calculate the position of the entire physical model with respect to animation time. Other embodiments include using motion-capture techniques, such as reflective dots, or the like, positioned on the physical model. In such embodiments, after being calibrated in space, the locations of the reflected dots, as captured by a video camera, or the like, and then the positions of the physical model can be determined with respect to time. In still other embodiments, the physical motion of the object may be captured through the use of a number of physical touch sensors located at key positions in space. These physical sensors then sense if or when the physical model moves to the key positions in space. In still other embodiments, laser distance measuring devices, or other three-dimensional scanning technologies can be used to help calculate the actual position of the physical model with respect to animation time, the path of the physical model, or the like.

Next, in various embodiments, based upon the animation data, the computer system can predict or determine the desired motion of various portions of the animated object in space and time, step 310. In some embodiments, the desired poses of the animatronics unit may simply be the poses and motions of the animated object driven with the animation data, e.g. source animated feature, or the like.

In various embodiments of the present invention, a determination is then made as to whether the actual space/time positions of the physical object are within an acceptable amount of deviation from the desired space/time positions for the period of time, step 330. In some embodiments, the deviation may depend upon what is important for the animation of the physical model. For example, it may be more important that the physical model performs an action at a particular instant in time, rather than how the physical model performs the action (i.e. moves); or it may be more important that the physical model closely follows a particular motion path, rather than the speed at which the physical model performs the motion; or any other combination. Accordingly, the amount and type of acceptable deviation are highly dependent upon application of the physical model of the object. As specific examples, the comparison data may indicate that the physical model of the object is not jumping high enough, is early or late in closing a hand, misses catching a falling object, or other motion-related deviation.

In various embodiments, in step 330 a of deviation may be an absolute deviation, a cumulative deviation, or any other type of deviation. For example, if the physical model deviates in space/time more than 10% from the predicted space/time positions at any time, the deviation may be unacceptable. As another example, if the physical model deviates in space/time positions by no more than 5% in space for 75% of the animation time, the deviation may be acceptable, even if it a peak space/time deviation is above 10%. In other examples, if the physical model fails to reach a position at a particular time, the physical model is over the threshold of acceptability. In other embodiments, other combinations of conditions may be used to set a threshold condition, depending upon the specific application. Additionally, the threshold may be automatically or manually set.

In various embodiments of the present invention, if the amount of deviation is not acceptable, the deviation (e.g. error signal) may be used to automatically or manually modify (e.g. with a weighting factor) the driving data for the physical model of the animatronics unit, step 340. In some examples, if the physical model of the object "hits" or reaches all the desired spatial locations, but is a bit slow, the driving data, e.g. motor current, may be increased; the driving data may be applied earlier in time; or the like. In other examples, if the physical model is not "hitting" or reaching the desired spatial locations, the driving data, e.g. motor current, may also be increased; pauses in the driving data may be introduced to enable the physical model to settle into specific locations; or the like. In other embodiments, many other ways to modify the driving data are contemplated.

In some embodiments of the present invention, the construction of the physical model may be automatically or manually modified to enable the physical model to reach the desired space/time positions. For example, the physical model may be reconstructed to use lighter-weight components to reduce inertia of the components, to use higher slew rate driving motors, or the like, to allow the physical model to move quicker; the physical model may be reconstructed to use stronger components or additional components to allow the physical model to handle greater stresses, handle larger loads, or to move quicker, or the like; the placement of physical components may be repositioned to allow the physical model to move quicker by utilizing greater leverage; and the like. Reconstruction may depend upon real-world experience of a physical model maker, or the like.

In other embodiments of the present invention, if the arm of the animatronics character "bounces" upon reaching the desired location at the desired time, the speed of the arm during a movement portion may be increased during most of the motion, but decreased when it nears the desired location (i.e. from a linear driving signal to a non-linear driving signal); lighter components may be used in the arm (to reduce inertia of the arm); or the like. In other embodiments, combinations of changes in driving signals, as well as physical construction, may be suggested in a design.

In still other embodiments of the present invention, the user may modify the animation data used to determine the driving signals in step 260. For example, the user may determine that the physical model simply cannot meet the desired space/time positions by using the techniques described above. In such cases, the user may specify a new set of animation data that will be used to determine driving signals in step 260. For example, if the physical model cannot move along a desired path to reach a position at a particular point in time, the user may specify a simplified path of movement via animation data, with the hope that the physical model could reach the position at the desired time.

In various embodiments, steps 250-340 may be repeated until the physical model of the object reaches the desired space/time positions desired by the user. In various embodiments, this process may be automated and/or include manual inputs reducing the space-time errors of the physical model of the object (driven using the animation data in step 200).

Figure 6:
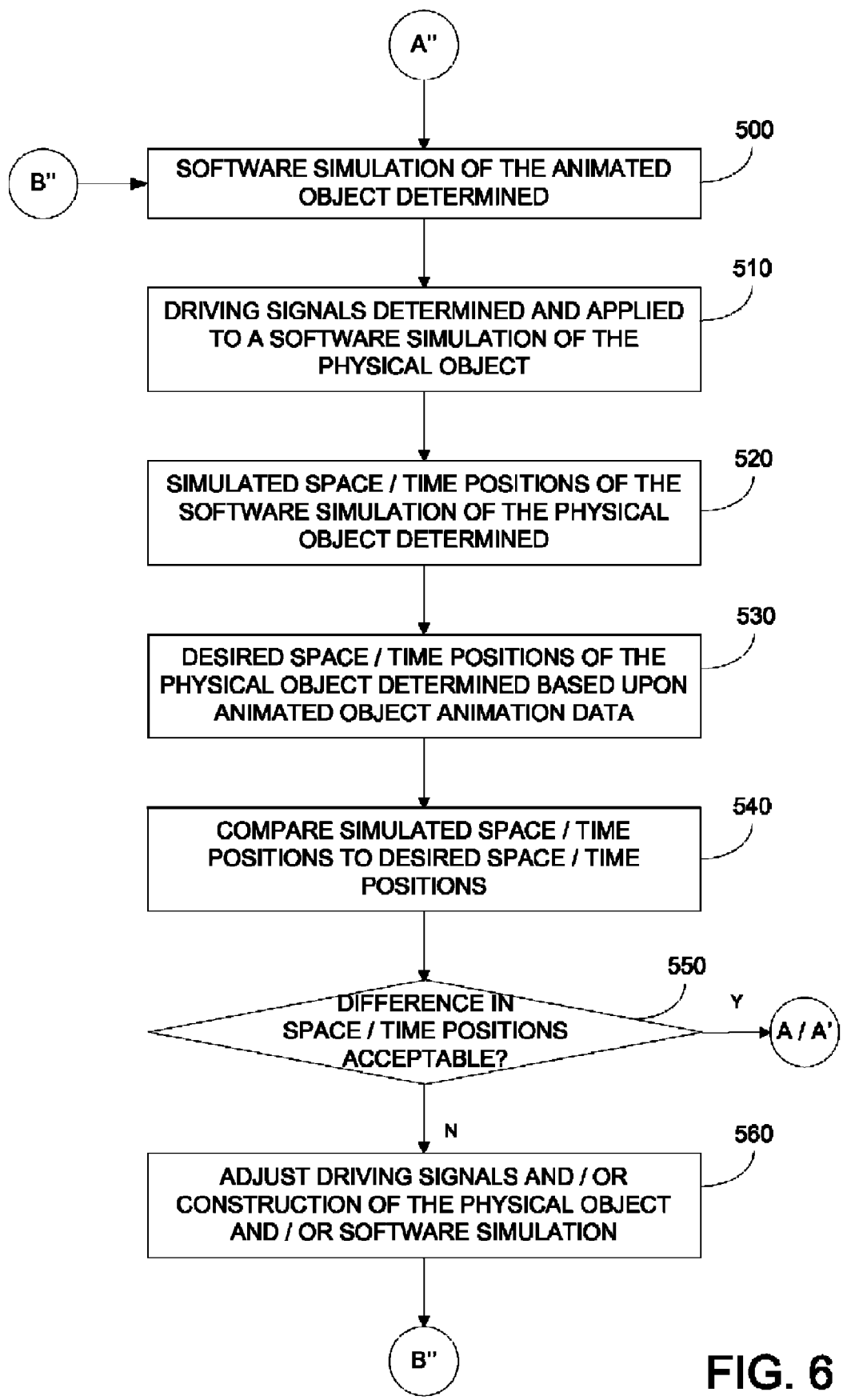
FIG. 6 illustrates a block diagram of a high-level illustration of additional embodiments.

FIG. 6 illustrates a block diagram of a high-level illustration of additional embodiments for modifying movement of the physical model of the object.

In various embodiments, a software simulation of the physical model of the object may be determined. In some embodiments, the software simulation may be made in conjunction with a computer-aided-design (CAD) simulation system, or the like. In other embodiments, a physical model of the object may have been built and the software model constructed in this step may be based upon the real-world performance of the physical model. For example, a software simulation of the object may be based upon the measured performances of the physical object performing certain motions.

In various embodiments, the software simulation can give the user an idea of how the physical model of the object can be posed and how the physical model can move, without requiring the physical model (animatronics unit) being available.

Such embodiments may be useful if the animation team is remote from the animatronics unit.

Similar to step 260, above, in various embodiments, the appropriate driving signals may be determined and applied to the software simulation in step 510. As above, the inventors recognize that a space-time behavior of the software simulation should be studied to improve the behavior of the animatronics unit.

In various embodiments, the poses and motions of the software simulation of the animatronics unit are recorded, and/or are observed by a user in step 520, similar to step 300, above. Next, in various embodiments, based upon the animation data, the computer system can predict or determine the desired motion of various portions of the animated object in space and time, step 530. In some embodiments, the desired poses of the animatronics unit may simply be the poses and motions of the animated object driven with the animation data, e.g. source animated feature, or the like.

In various embodiments of the present invention, a determination is then made as to whether the actual space/time positions of the software model of the physical object are within an acceptable amount of deviation from the desired space/time positions for the period of time, step 540. As discussed above, in some embodiments, the deviation may depend upon what is important for the animation of the physical model. For example, it may be more important that the physical model performs an action at a particular instant in time, rather than how the physical model performs the action (i.e. moves); or it may be more important that the physical model closely follows a particular motion path, rather than the speed at which the physical model performs the motion; or any other combination. Accordingly, the amount and type of acceptable deviation are highly dependent upon application of the physical model of the object. As specific examples, the comparison data may indicate that the physical model of the object is not jumping high enough, is early or late in closing a hand, misses catching a falling object, or other motion-related deviation.

In various embodiments, similar to step 330 above, a of deviation may be an absolute deviation, a cumulative deviation, or any other type of deviation the like. For example, if the physical model deviates in space/time more than an average of 20% from the predicted space/time positions at any time, the deviation may be unacceptable. In other examples, if the physical model fails to reach a position at a particular time, the physical model is over the threshold of acceptability.

In various embodiments of the present invention, if the amount of deviation is not acceptable, the deviation (e.g. error signal) may be used to automatically or manually modify (e.g. with weighting factors) the driving data for the animatronics unit, step 560. In some examples, if the software simulation of the object "hits" or reaches all the desired spatial locations, but is too early, a hydraulic pump may turned on later in time; the oil pressure of the hydraulic system may be decreased; or the like. In other examples, if the software simulation of the physical model is not "hitting" or reaching the desired spatial locations, the air pressure of a pneumatic system may be increased; the pneumatic system may be activated earlier in time; or the like. In other embodiments, many other ways to modify the driving data are contemplated.

In various embodiments, steps 500-560 may be repeated until the software simulation of the animatronics unit reaches the desired space/time positions desired by the user. In various embodiments, this process may be automated and/or include manual inputs reducing the space-time errors of the physical model of the object (driven using the animation data in step 200).

In some embodiments, when the software simulation meets the space-time constraints desired by the user, the process may return to FIG. 2B or FIG. 3, as illustrated. In such cases, if the animatronics unit has not be built, in step 250, the physical model may be constructed and tuned according to the respective processes. In other cases, if the animatronics unit has already been built, step 250 may be include making changes to the animatronics unit, as determined in step 560. In still some other cases, step 250 may have already been performed and the animatronics unit may already have been built.

Figure 4A:
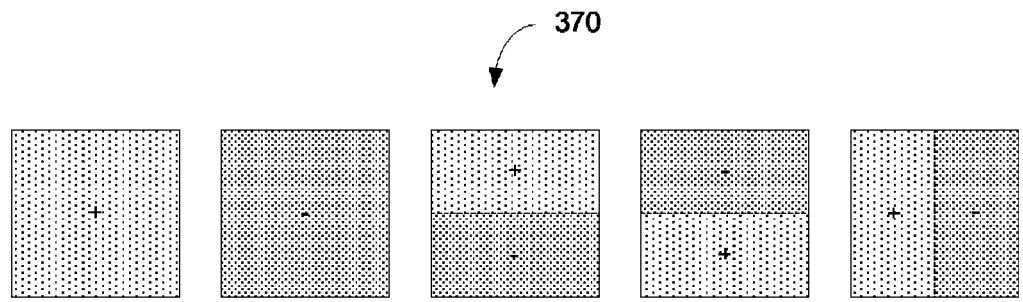
FIGS. 4A-B illustrates examples according to various embodiments of the present invention.
Figure 4B:
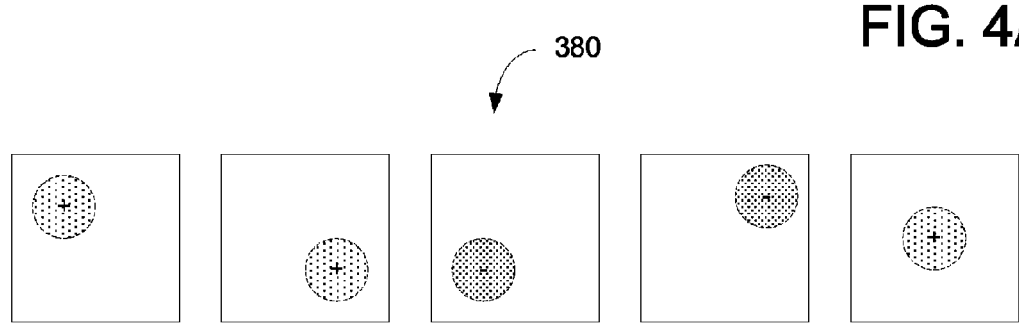

FIGS. 4A-B illustrates examples according to various embodiments of the present invention. FIG. 4A illustrate examples of global primary modes 370 determined for an example data set associated with an object surface. In the example, the + and − portions represent changes in relative depth. As can be seen the + and − portions in the global primary modes 370 extend beyond a small region.

In contrast, FIG. 4B illustrate examples of local modes 380 determined based upon the global primary modes, after a factor rotation. In this example, the + and − portions also represent changes in relative depth. As can be seen the + and − portions in the local modes affect a smaller area. According the various embodiments described above, the local modes are relatively distinct regions on the object surface, that may thusly be associated with a respective physical control structure.

Figure 5A:
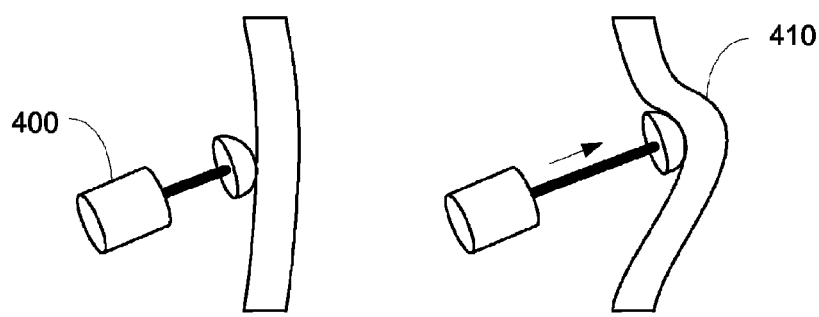
FIGS. 5A-C illustrate examples of physical control structures according to various embodiments of the present invention.
Figure 5B:
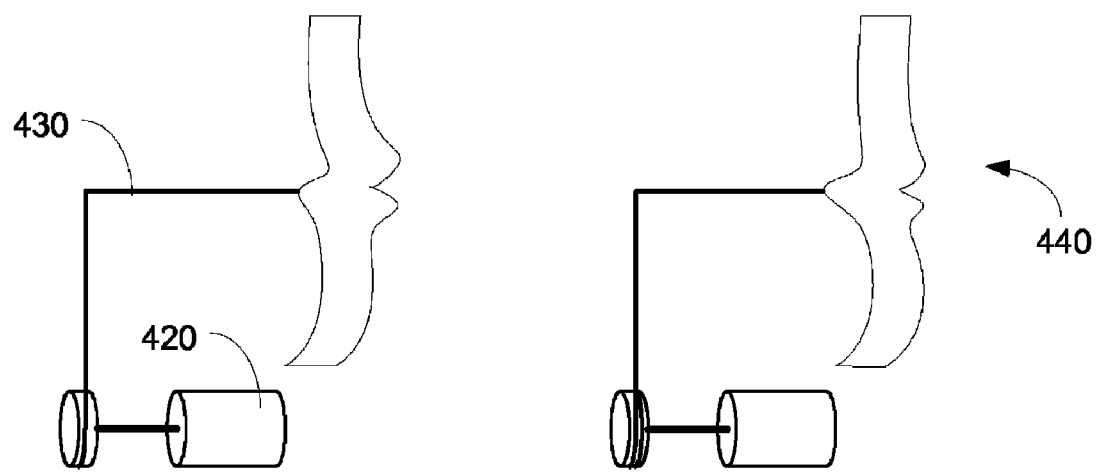
Figure 5C:
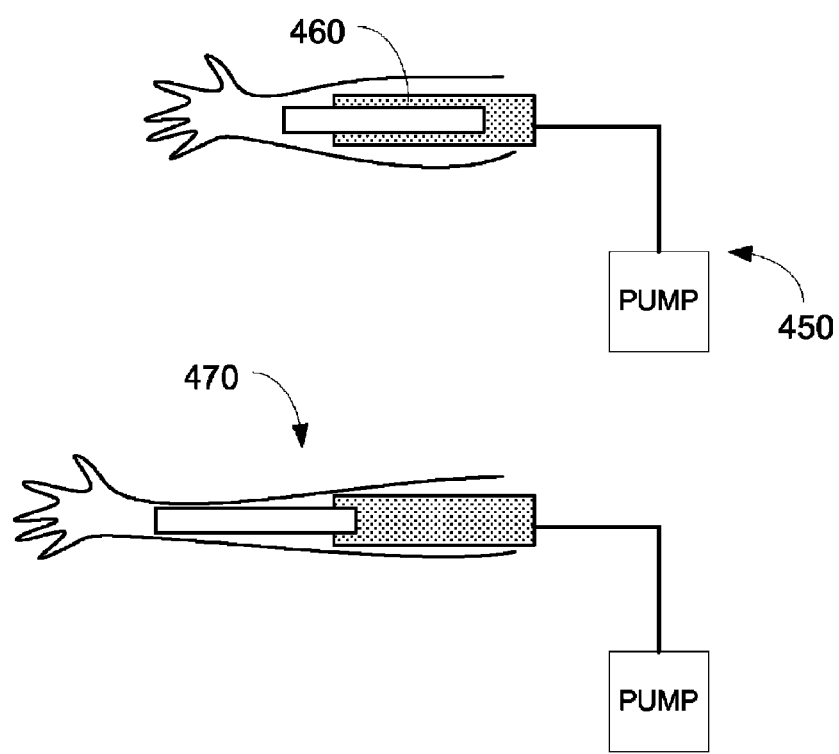

FIGS. 5A-C illustrate examples of physical control structures according to various embodiments of the present invention. FIG. 5A illustrates an example of a motor 400 being used to cause a localized bulge 410, for example, a cheek of a smiling person. FIG. 5B illustrates an example of a motor 420 being connected to a wire 430, used to cause a localized depression 440, for example, the lips of a frowning person. FIG. 5C illustrates an example of a pressurized system 450, (e.g. hydraulic, pneumatic) being connected to a piston 460, used to cause a stretching effect 470 or an arm.

In light of the above disclosure, one of ordinary skill in the art will understand that many other types of modal analysis may be performed to determine global and localized movement modes. Additionally, in light of the above disclosure, one of ordinary skill in the art will understand that many other ways to implement physical control structures can be used and combined to bring a physical representation of the animated character "to life."

Further embodiments can be envisioned to one of ordinary skill in the art after reading this disclosure. In other embodiments, combinations or sub-combinations of the above disclosed embodiments can be advantageously made. The block diagrams of the architecture and flow diagrams are grouped for ease of understanding. However it should be understood that combinations of blocks, additions of new blocks, re-arrangement of blocks, and the like are contemplated in alternative embodiments of the present invention.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A method for determining behavior of an animatronics unit comprising:

receiving animation data comprising artistically determined motions for at least a portion of an animated character;
determining a plurality of control signals to be applied to the portion of the animatronics unit in response to the animation data;
estimating the behavior of at least the portion of the animatronics unit in response to the plurality of control signals by driving a software simulation of at least the portion of the animatronics unit with the plurality of control signals;
comparing the behavior of the at least the portion of the animatronics unit to the artistically determined motions to form a comparison; and
outputting a representation of the comparison or the behavior of at least the portion of the animatronics unit to a user.

2. The method of claim 1
wherein the animation data describes a specified pose for at least the portion of the animatronics unit;
wherein the behavior comprises a predicted pose for at least the portion of the animatronics unit; and
wherein the method further comprises modifying the animation data in response to the specified pose and to the predicted pose.

3. The method of claim 1
wherein the animation data describes a specified pose for at least the portion of the animatronics unit;
wherein the behavior comprises a predicted pose for at least the portion of the animatronics unit; and
wherein the method further comprises modifying the software simulation of at least the portion of the animatronics unit in response to the specified pose and to the predicted pose.

4. The method of claim 3 further comprising:
estimating a modified behavior of at least the portion of the animatronics unit in response to the plurality of control signals by driving the software simulation of at least the portion of the animatronics unit that was modified with the plurality of control signals; and
outputting a representation of the modified behavior of at least the portion of the animatronics unit to the user.

5. The method of claim 1
wherein the animation data describes a specified motion for at least the portion of the animatronics unit;
wherein the behavior comprises a predicted motion for at least the portion of the animatronics unit; and
wherein the method further comprises modifying the animation data in response to the specified motion and to the predicted motion.

6. The method of claim 1
wherein the animation data describes a specified motion for at least the portion of the animatronics unit;
wherein the behavior comprises a predicted motion for at least the portion of the animatronics unit; and
wherein the method further comprises modifying the software simulation model of at least the portion of the animatronics unit in response to the specified motion and to the predicted motion.

7. The method of claim 1
wherein the animation data describes a specified motion for at least the portion of the animatronics unit; and
wherein determining the plurality of control signals comprises:
determining enhanced space-time specified motion for at least the portion of the animatronics unit in response to the specified motion; and
determining the plurality of control signals to be applied to at least the portion of the animatronics unit in response to the enhanced space-time specified motion.

8. A computer system for determining behavior of an animatronics unit comprising:
a memory configured to store animation data comprising artistically determined motions for at least a portion of an animated character;
a processor coupled to the memory, wherein the processor is configured to determine a plurality of control signals to be applied to the portion of the animatronics unit in response to the animation data, wherein the processor is configured to estimate the behavior of at least the portion of the animatronics unit in response to the plurality of control signals by driving a software simulation of at least the portion of the animatronics unit with the plurality of control signals, wherein the processor is configured to compare the behavior of the at least the portion of the animatronics unit to the artistically determined motions to form a comparison; and wherein the processor is configured to output a representation of the comparison or the behavior of at least the portion of the animatronics unit to a user.

9. The computer system of claim 8
wherein the animation data describes a specified pose for at least the portion of the animatronics unit;
wherein the behavior comprises a predicted pose for at least the portion of the animatronics unit; and
wherein the processor is configured to modify the animation data in response to the specified pose and to the predicted pose.

10. The computer system of claim 9
wherein the processor is configured to determine a plurality of modified control signals in response to the animation data that was modified;
wherein the processor is configured to estimate a modified behavior of at least the portion of the animatronics unit in response to the plurality of modified control signals by driving the software simulation of at least the portion of the animatronics unit with the plurality of modified control signals; and
wherein the processor is configured to output a representation of the modified behavior of at least the portion of the animatronics unit to a user.

11. The computer system of claim 8
wherein the animation data describes a specified pose for at least the portion of the animatronics unit;
wherein the behavior comprises a predicted pose for at least the portion of the animatronics unit; and
wherein the processor is configured to modify the software simulation of at least the portion of the animatronics unit in response to the specified pose and to the predicted pose.

12. The computer system of claim 8
wherein the animation data describes a specified motion for at least the portion of the animatronics unit;
wherein the behavior comprises a predicted motion for at least the portion of the animatronics unit; and
wherein the processor is configured to modify the animation data in response to the specified motion and to the predicted motion.

13. The computer system of claim 8
wherein the animation data describes a specified motion for at least the portion of the animatronics unit;
wherein the behavior comprises a predicted motion for at least the portion of the animatronics unit; and wherein the processor is configured to modify the software simulation model of at least the portion of the animatronics unit in response to the specified motion and to the predicted motion.

14. The computer system of claim 8
wherein the animation data describes a specified motion for at least the portion of the animatronics unit;
wherein the processor is configured to determine enhanced space-time specified motion for at least the portion of the animatronics unit in response to the specified motion; and
wherein the processor is configured to determine the plurality of control signals to be applied to at least the portion of the animatronics unit in response to the enhanced space-time specified motion.

15. A computer program product resident on a non-transitory tangible media comprises executable code that is executable on a computer system, wherein the computer system includes a processor and a memory, the computer program product comprising:
code configured to direct the processor to receive animation data comprising artistically determined motions for at least a portion of an animated character;
code configured to direct the processor to determine a plurality of control signals to be applied to the portion of the animatronics unit in response to the animation data;
code configured to direct the processor to estimate the behavior of at least the portion of the animatronics unit in response to the plurality of control signals by driving a software simulation of at least the portion of the animatronics unit with the plurality of control signals;
code configured to direct the processor to compare the behavior of the at least the portion of the animatronics unit to the artistically determined motions to form a comparison; and
code configured to direct the processor to output a representation of the comparison or the behavior of at least the portion of the animatronics unit to a user.

16. The computer program product of claim 15
wherein the animation data describes a specified pose for at least the portion of the animatronics unit;
wherein the behavior comprises a predicted pose for at least the portion of the animatronics unit; and
wherein the computer program product of claim further comprises code configured to direct the processor to modify the animation data in response to the specified pose and to the predicted pose.

17. The computer program product of claim of claim 16
wherein the animation data describes a specified pose for at least the portion of the animatronics unit;
wherein the behavior comprises a predicted pose for at least the portion of the animatronics unit; and
wherein the computer program product of claim further comprises code configured to direct the processor to modify the software simulation of at least the portion of the animatronics unit in response to the specified pose and to the predicted pose.

18. The computer program product of claim 15
wherein the animation data describes a specified motion for at least the portion of the animatronics unit;
wherein the behavior comprises a predicted motion for at least the portion of the animatronics unit; and
wherein the computer program product of claim further comprises code configured to direct the processor to modify the animation data in response to the specified motion and to the predicted motion.

19. The computer program product of claim 15
wherein the animation data describes a specified motion for at least the portion of the animatronics unit;
wherein the behavior comprises a predicted motion for at least the portion of the animatronics unit; and
wherein the computer program product of claim further comprises code configured to direct the processor to modify the software simulation model of at least the portion of the animatronics unit in response to the specified motion and to the predicted motion.

20. The computer program product of claim 15
wherein the animation data describes a specified motion for at least the portion of the animatronics unit; and
wherein the computer program product of claim further comprises:
code configured to direct the processor to determine enhanced space-time specified motion for at least the portion of the animatronics unit in response to the specified motion; and
code configured to direct the processor to determine the plurality of control signals to be applied to at least the portion of the animatronics unit in response to the enhanced space-time specified motion.

* * * * *